United States Patent [19]
Ichiguchi

[11] Patent Number: 4,916,671
[45] Date of Patent: Apr. 10, 1990

[54] SEMICONDUCTOR MEMORY DEVICE HAVING SENSE AMPLIFIER HAVING IMPROVED ACTIVATION TIMING THEREOF AND OPERATING METHOD THEREOF

[75] Inventor: Tetsuichiro Ichiguchi, Hyogo, Japan

[73] Assignee: Mitsubishi Denki Kabushiki Kaisha, Tokyo, Japan

[21] Appl. No.: 313,680

[22] Filed: Feb. 22, 1989

[30] Foreign Application Priority Data

Sep. 6, 1988 [JP] Japan .................................. 63-224106

[51] Int. Cl.[4] .............................................. G11C 7/00
[52] U.S. Cl. .................................... 365/233; 365/207
[58] Field of Search ........................ 365/205, 227, 233

[56] References Cited

U.S. PATENT DOCUMENTS 4,581,720 4/1986 Takemae et al. .................... 365/222

FOREIGN PATENT DOCUMENTS 223994 12/1984 Japan .
20297 1/1986 Japan .
68797 4/1986 Japan .

OTHER PUBLICATIONS

ISSCC: "A 1Mb CMOS DRAM With Fast Page and Static Column Modes", by S. Saito et al, Session XVII, 2/15/85, pp. 252–253.
IEEE J. of Sol. St. Circuits: "A 65-ns 4-Mbit CMOS DRAM with a Twisted Driveline Sens Amplifier", by K. Kimura et al, vol. SC-22, No. 5, Oct. 1987, pp. 651–656.

Primary Examiner—James W. Moffitt
Attorney, Agent, or Firm—Lowe, Price, LeBlanc, Becker & Shur

[57] ABSTRACT

A dynamic random access memory comprises memory cells (MA1-Man) and sense amplifies (SA1-SAn) in a memory array region III and memory cells (MB1-MBn) and sense amplifies (SB1-SBn) in a memory array region IV. In reading operation, first, the sense amplifiers in one region comprising a memory cell designated by an address signal are activated and then sense amplifiers in the other region are activated. As a result, since amplifying operation by the sense amplifiers is performed sequentially, a peak value of a current consumed by the amplification can be reduced.

9 Claims, 10 Drawing Sheets

SEMICONDUCTOR MEMORY DEVICE HAVING SENSE AMPLIFIER HAVING IMPROVED ACTIVATION TIMING THEREOF AND OPERATING METHOD THEREOF

BACKGROUND OF THE INVENTION

1. Field of the Invention

The present invention generally relates to a semiconductor memory device and, more particularly, to activation of a sense amplifier thereof. The present invention has particular applicability for a dynamic random access memory device.

2. Description of the Background Art

Figure 5:
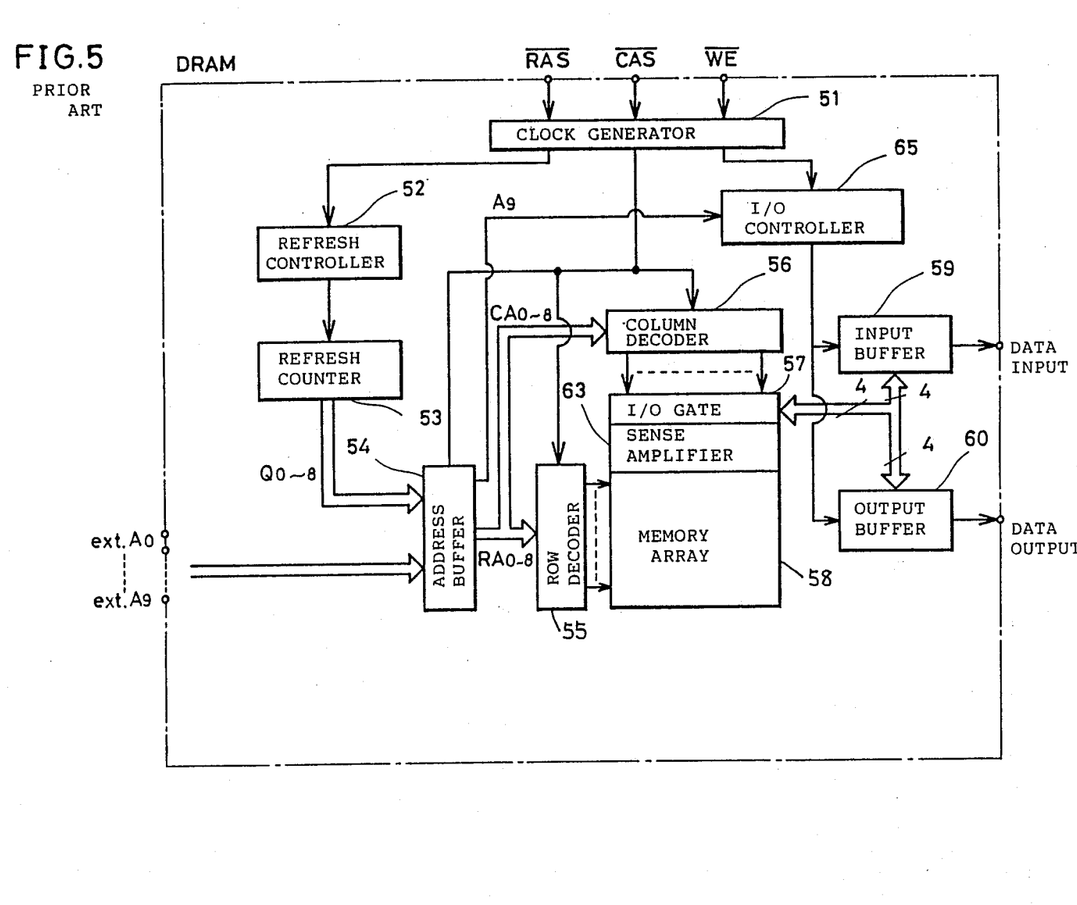
FIG. 5 is a block diagram showing a conventional DRAM.

FIG. 5 is a block diagram showing one example of a well-known conventional dynamic random access memory (hereinafter referred to as a DRAM). Referring to FIG. 5, the DRAM comprises a memory array 58 comprising memory cells for storing a data signal, an address buffer 54 receiving an address signal to select a memory cell, a row decoder 55 and a column decoder 56 which decode an address signal, and a sense amplifier 63 connected to the memory array 58 and amplifying and reading a signal stored in the memory cell. An input buffer 59 for inputting the data signal and an output buffer for outputting the data signal are connected to the memory array 58 through an I/O gate 57.

The address buffer 54 is connected to receive external address signals ext. A0 to A9 or internal address signals Q0 to Q8 generated from a refresh controller 52. The refresh controller 52 drives a refresh counter 53 in response to the timing of $\overline{RAS}$ and $\overline{CAS}$ signals applied to a clock generator 51.

Figure 6A:
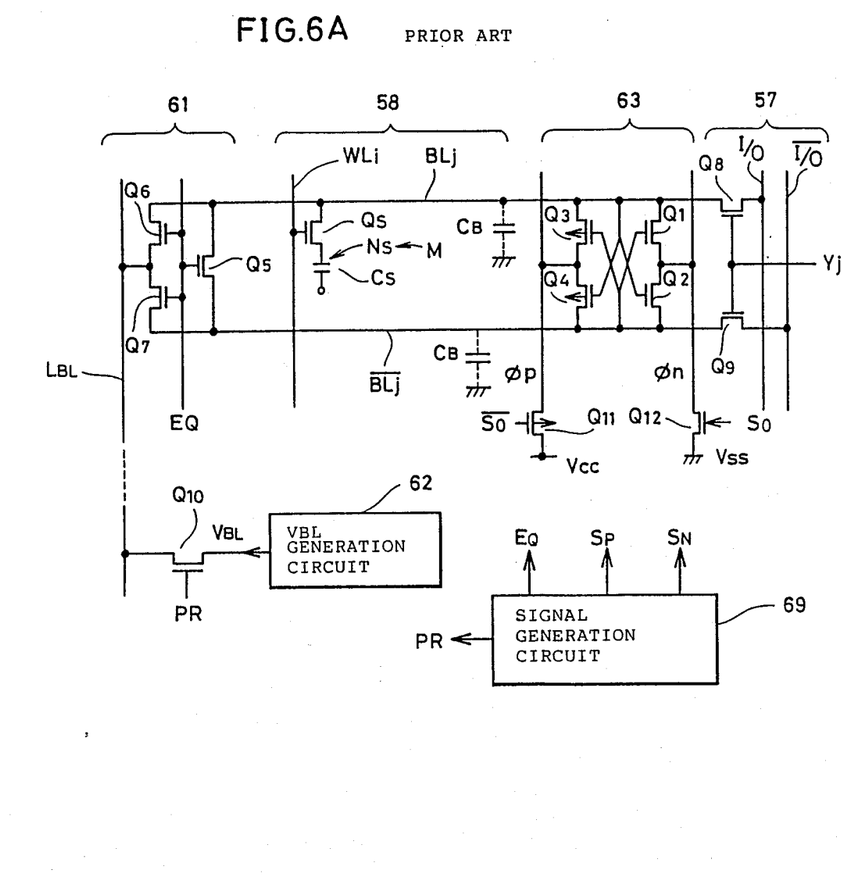
FIG. 6A is a circuit diagram showing a circuit connected to a conventional bit line pair.
Figure 6B:
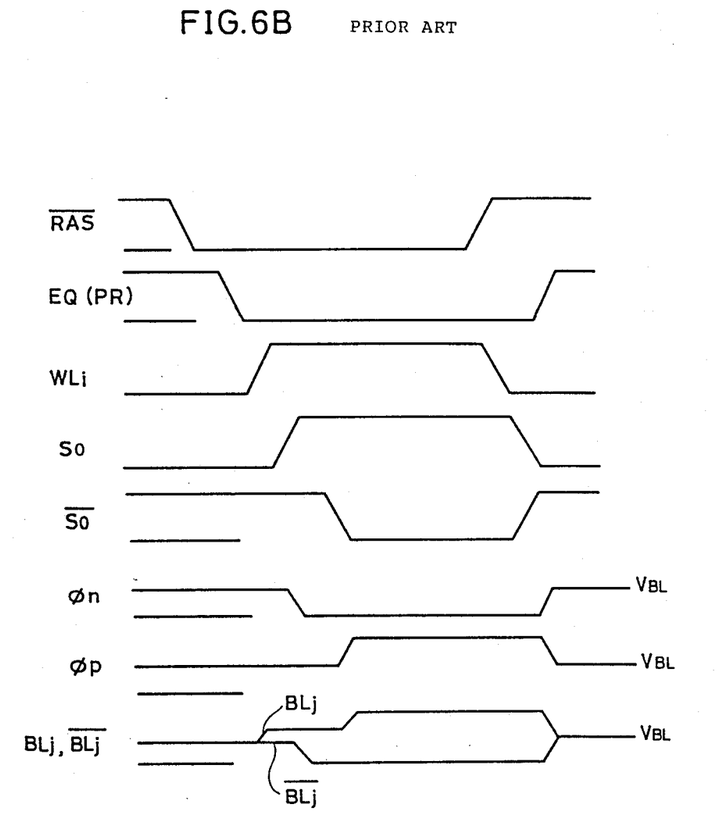
FIG. 6B is a timing chart for describing operation of the circuit shown in FIG. 6A.

FIG. 6A is a circuit diagram showing a peripheral circuit of the memory array 58 of the DRAM shown in FIG. 5. FIG. 6B is a timing chart for describing its operation thereof. These are seen, for example, on pages 252 to 253 in a Digest of Technical Papers of International Solid State Circuit Conference held on Feb. 15, 1985 (Session XVII).

Referring to FIG. 6A, a memory cell M is connected to a bit line BLj and a word line WLi. The memory cell M comprises a capacitor Cs for storing a data signal and an NMOS transistor Qs for switching. A sense amplifier 63 comprises a CMOS flip-flop connected between the bit lines BLj and $\overline{BL}$j. This CMOS flip flop comprises a P channel sense amplifier comprising PMOS transistors Q3 and Q4, and an N channel sense amplifier comprising NMOS transistors Q1 and Q2. The CMOS flip-flop is connected to the power supply Vcc and the ground Vss through a PMOS transistor Q11 and an NMOS transistor Q12. The transistors Q11 and Q12 have their gates connected to receive sense trigger signals $\overline{So}$ and So, respectively. An equalize circuit 61 comprises an NMOS transistor Q5 connected between the bit lines BLj and $\overline{BL}$j and NMO transistors Q6 and Q7 connected in series. The gates of these transistors are connected to receive an equalize signal EQ.

A bit line precharge voltage (hereinafter referred to as a $V_{BL}$) generation circuit 62 is connected to the junction of the transistors Q6 and Q7 through an NMOS transistor Q10. An I/O gate 57 comprises an NMOS transistor Q8 connected between the bit line BLj and an I/O line and an NMOS transistor Q9 connected between the bit line $\overline{BL}$j and an $\overline{I/}$ line. The transistors Q8 and Q9 have their gates connected to receive a signal Yj from a column decoder. The signal generation circuit 69 is provided for generating control signals PR, EQ, So and $\overline{So}$ for controlling these circuits.

Referring to FIGS. 6A and 6B, a description is made of reading operation and refresh operation of the DRAM.

First, the equalize signal EQ and the precharge signal PR are generated from the signal generation circuit 69. The transistors Q10, Q5, Q6 and Q7 turn on in response to these signals and the bit line pair of BLj and $\overline{BL}$j are equalized to be brought to VBL (in general a voltage Vcc/2). After a $\overline{RAS}$ signal falls, the signals EQ and PR change to a low level. Then, a word line signal WLi changes to a high level and the switching transistor Qs of the memory cell M turns on. A voltage of the bit line BLj changes a little when a signal from the memory cell M is applied, whereby a small voltage difference between the bit line $\overline{BL}$j and the bit line BLj is generated.

On the other hand, at this time, the signals So and $\overline{So}$ change and the sense amplifier is driven. Then, the small voltage difference generated between the bit lines is amplified by the sense amplifier 63. Thereafter, by applying a high level signal Yj, the amplified data signal is applied to the I/O line pair through the transistors Q8 and Q9.

In refresh operation, the amplified data signal is not applied to the I/O line pair, but it is only applied to the capacitor Cs of the memory cell again.

Figure 7:
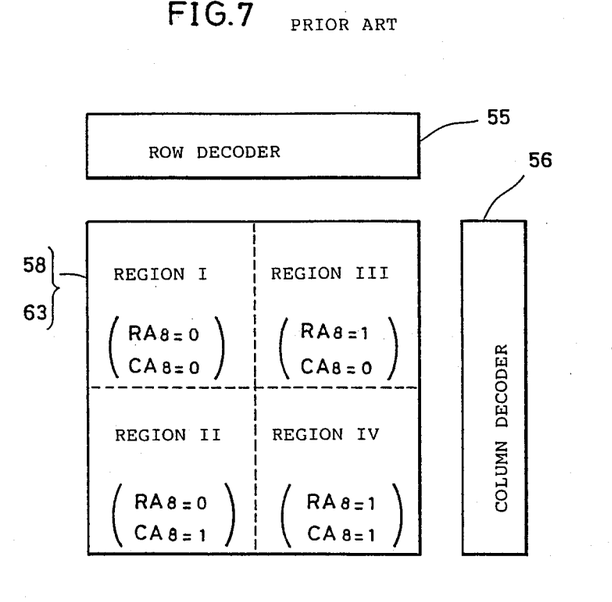
FIG. 7 is a conceptual diagram showing four regions in a memory array and a sense amplifier shown in FIG. 5.

FIG. 7 is a conceptual diagram showing the corresponding relation between regions of the memory array 58 and the sense amplifier 63 shown in FIG. 5 and the address signal. As shown in FIG. 7, the regions comprising the memory array 58 and the sense amplifier 63 correspond to row address signals RA8 and column address signals CA8 and can be divided into four regions I to IV. Therefore, for example, the address signal for designating a certain memory cell in the region IV comprises the row address signal RA8 of "1" and the column address signal CA8 of "1".

Figure 8:
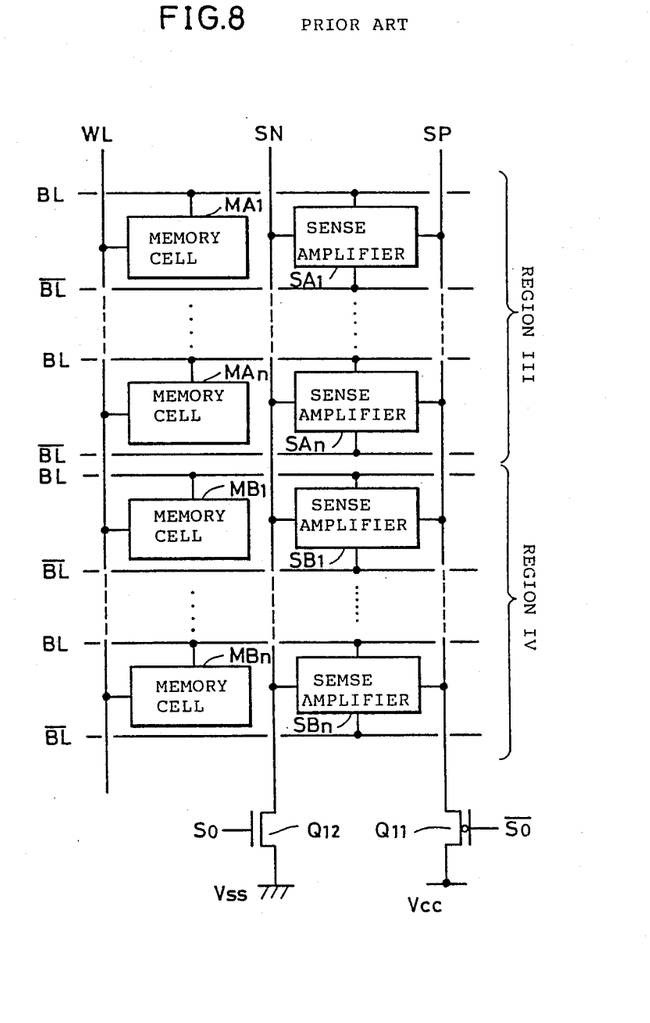
FIG. 8 is a circuit diagram showing one portion of regions III and IV shown in FIG. 7.

FIG. 8 is a circuit diagram showing partially the regions III and IV shown in FIG. 7. In the region III, there are provided memory cells MA1 to MAn and sense amplifiers SA1 to SAn which are connected to a bit line pair of BL and $\overline{BL}$. Similarly, in the region IV, there are provided memory cells MB1 to MBn and sense amplifiers SB1 to SBn. An activation line SN is connected to the ground Vss through the transistor Q12 and the activation line SP is connected to the power supply Vcc through the transistor Q11. Each of the memory cells and the sense amplifiers has the same circuit structure as that shown in FIG. 6A.

An example of prior art of particular interest to the present invention is seen in Japanese Patent Laying-Open Gazette No. 68797/1986. In this prior art, ability to drive sense amplifier is varied in response to a column address signal.

Another example of the prior art of particular interest to the present invention is seen in Japanese Patent Laying-Open Gazette No. 20297/1986. This prior art discloses an example of a circuit which drives a plurality of sense amplifiers with signals having different timings. These sense amplifiers are driven without responding to the address signal.

A further example of the prior art of particular interest to the present invention is seen in IEEE Journal of Solid State Circuit (VOL. SC-22, No. 5) issued in October 1987 (pages 651–656). In this example, ability to drive a sense amplifier is raised in response to driving signals having different timings.

Still another example of the prior art of particular interest to the present invention is seen in Japanese Patent Laying-Open Gazette No. 223994/1984. In this example, there is shown a timing control of the equalization of a bit line pair.

Figure 9:
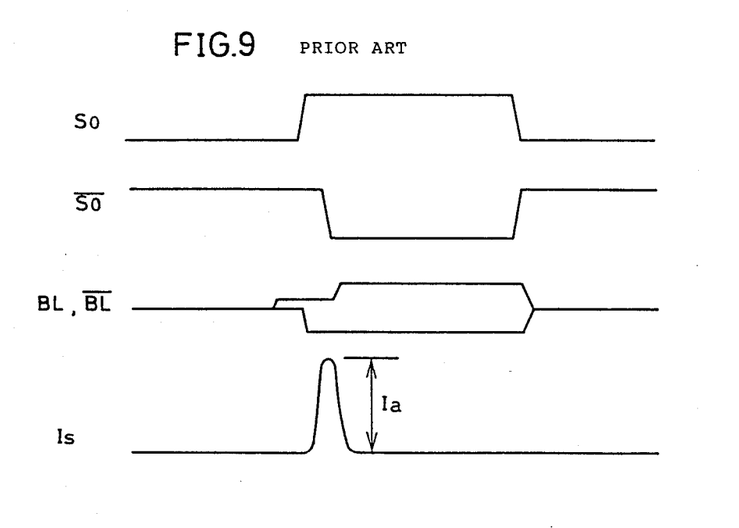
FIG. 9 is a timing chart for describing operation of the circuit shown in FIG. 8.

FIG. 9 is a timing chart showing changes of each signal when the sense amplifier shown in FIG. 8 is activated. Referring to FIGS. 8 and 9, for example when the data signal of the memory cell MB1 in the region IV is read in reading operation, all sense amplifiers SA1 to SAn and SB1 to SBn in the regions III and IV are activated. More specifically, as described above, the transistors Q12 and Q11 turn on in response to the sense trigger signals So and $\overline{So}$. A small voltage generated on the bit line pair of BL and $\overline{BL}$ in the regions III and IV is amplified by the activation of these sense amplifiers. Since all sense amplifiers in the regions III and IV are activated at the same time, a current Is consumed by the sense amplifiers is increased rapidly and shows a peak value Ia. The rapid increase in this consumption of the current Is causes the supply voltage to drop and this drop of the supply voltage causes the sensitivity of the sense amplifier to deteriorate.

SUMMARY OF THE INVENTION

An object of the present invention is to provide a semiconductor memory device in which a peak value of a current for activating a sense amplifier is reduced.

Another object of the present invention is to provide a semiconductor memory device which can prevent a drop in the supply voltage caused by the rapid increase in current consumption.

A further object of the present invention is to provide a semiconductor memory device which can prevent deterioration in the sensitivity of a sense amplifier caused by the rapid increase in current consumption.

Yet another object of the present invention is to provide a dynamic random access memory in which a peak value of a current for activating a sense amplifier is reduced.

Still another object of the present invention is to provide a dynamic random access memory which can prevent a drop in the supply voltage caused by the rapid increase in current consumption.

A further object of the present invention is to provide a dynamic random access memory which can prevent deterioration in the sensitivity of a sense amplifier caused by the rapid increase in current consumption.

In brief, a semiconductor memory device in accordance with the present invention comprises a memory array comprising a first memory array region including a memory cell designated by an address signal and a second memory array region not including the designated memory cell; a first amplifying circuit amplifying the data signal in the first memory array region; a second amplifying circuit amplifying the data signal in the second memory array region; and a sequentially activating circuit activating the first and second amplifying means in this order in response to an address signal.

In operation, first, the data signal in the first array region is amplified in response to the address signal and then the data signal in the second array region is amplified. Since amplifying operation is performed sequentially in this way, a peak value of current consumption for amplification can be reduced.

A method for operating a semiconductor memory device in accordance with the present invention comprises the steps of selecting a first memory array region including a memory cell designated by an address signal; selecting a second memory array region not including the designated memory cell; amplifying the data signal stored in the memory cell in the first memory array region; and amplifying the data signal of the second memory array region after the data signal in the fist memory array region is amplified.

Since the data signals in the first and second memory array regions are amplified at different timings, the peak value of a current consumed by the amplification can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
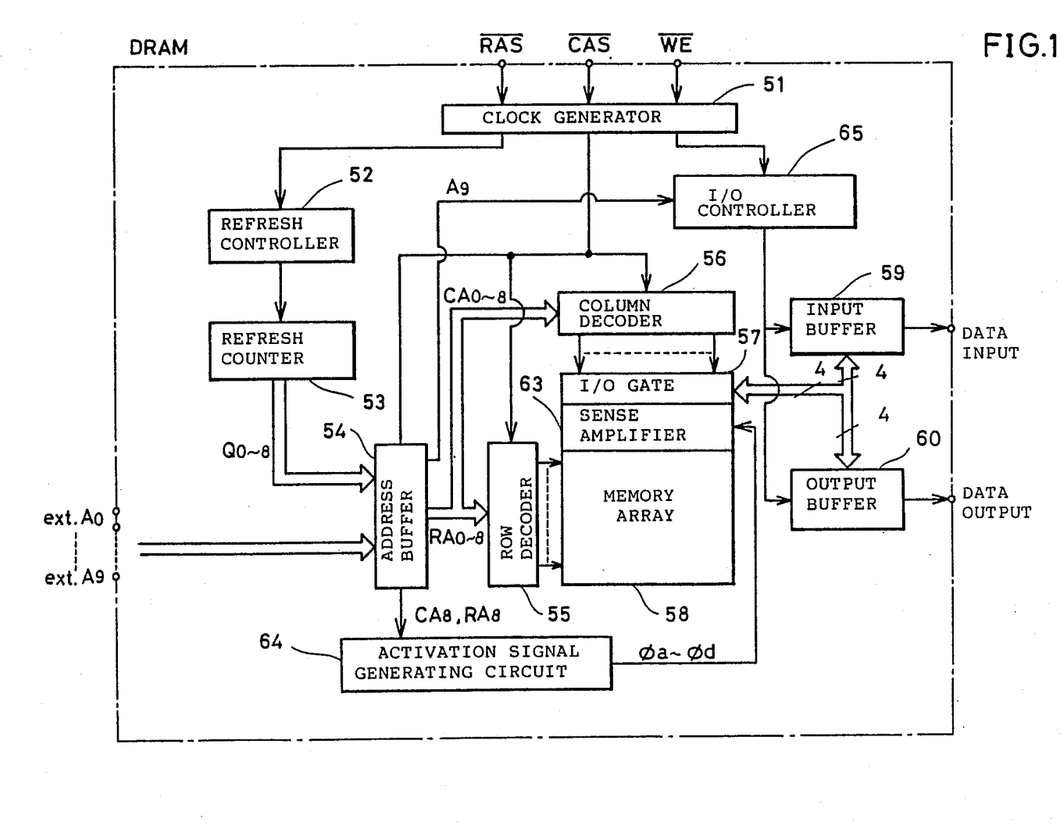
FIG. 1 is a block diagram a showing a DRAM in accordance with one embodiment of the present invention.

FIG. 1 is a block diagram of a DRAM showing one embodiment of the present invention. Referring to FIG. 1, the DRAM is different from a conventional DRAM shown in FIG. 5 in that there is newly provided an activation signal generating circuit 64 which is connected to receive a row address signal $RA_8$ and a column address signal $CA_8$ from an address buffer 54. A sense amplifier 63 is connected to receive output signals $\phi a$ to $\phi d$ from this activation signal generating circuit 64.

Figure 2:
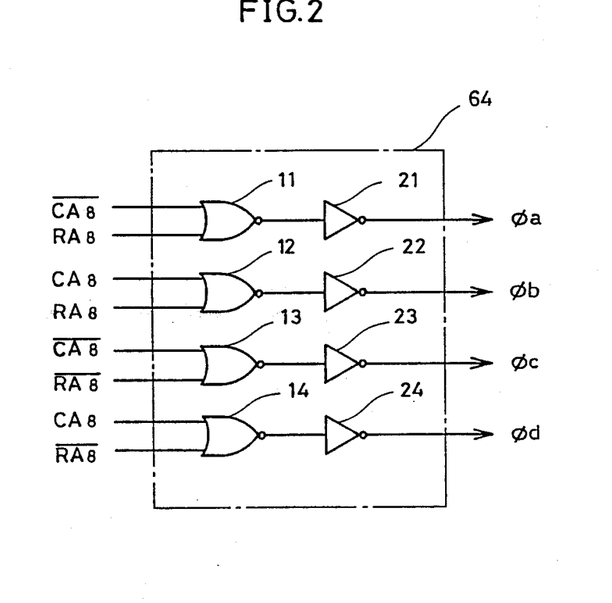
FIG. 2 is a circuit diagram showing an example of an activation signal generating circuit shown in FIG. 1.

FIG. 2 is a circuit diagram showing one example of the activation signal generating circuit 64 shown in FIG. 1. Referring to FIG. 2, the activation signal generating circuit 64 comprises four NOR gates 11 to 14 and inverters 21 to 24 each connected to the output of each of NOR gates 11 to 14. The NOR gate 11 has one input connected to receive a column address signal $\overline{CA_8}$ and the other input connected to receive a row address signal $RA_8$. Similarly, the NOR gates 12 to 14 are connected to receive signals $CA_8$ and $RA_8$, signals $\overline{CA_8}$ and $\overline{RA_8}$, and signals $CA_8$ and $\overline{RA_8}$, respectively. The output signals $\phi a$ to $\phi d$ for activating a sense amplifier are outputted through the inverters 21 to 24, respectively.

These output signals φa to φd are applied to the sense amplifier 63 shown in FIG. 1.

Figure 3A:
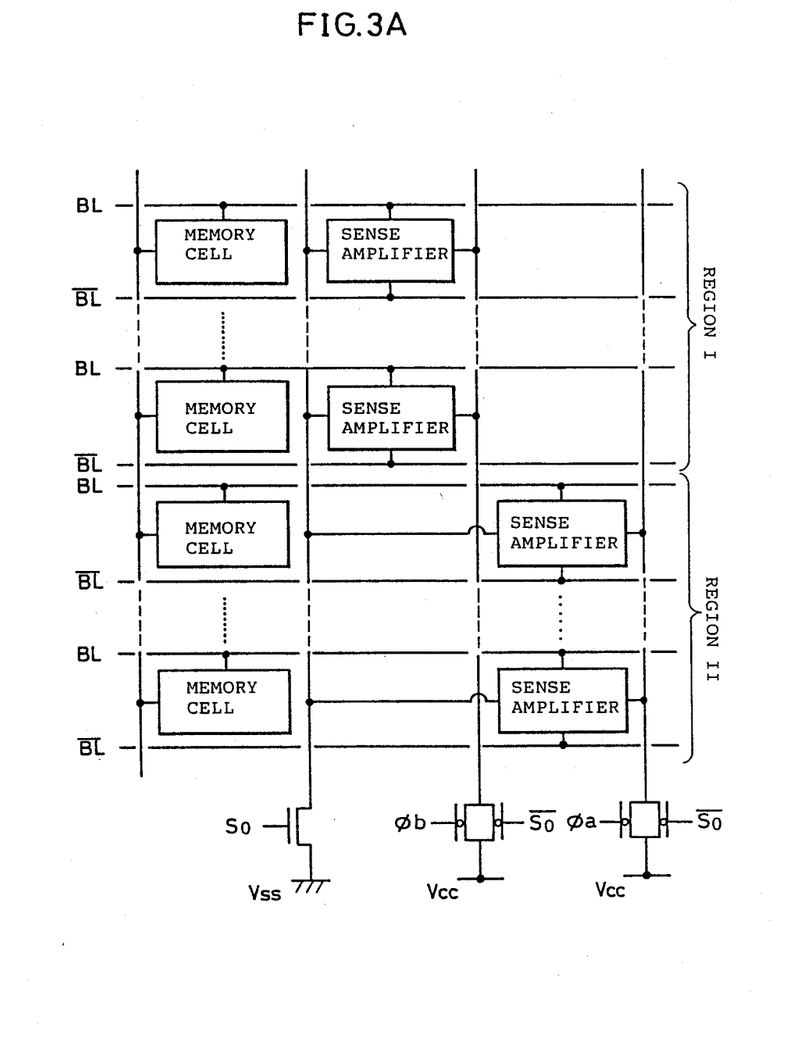
FIGS. 3A and 3B are circuit diagrams showing separately activated regions of a memory array and sense amplifier shown in FIG. 1.
Figure 3B:
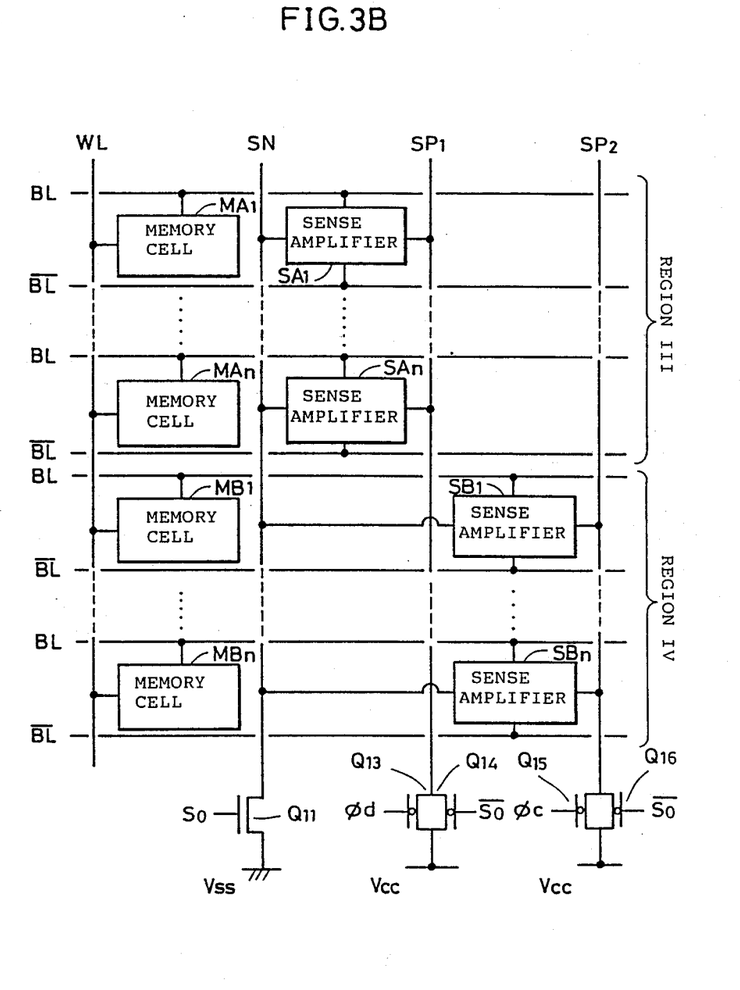

FIGS. 3A and 3B are circuit diagrams showing regions I to IV of the memory array 58 and the sense amplifier 63 shown in FIG. 1. For example, referring to FIG. 3B, the circuit is different from the conventional circuit shown in FIG. 8 in that sense amplifiers SA1 to SAn in the region III and sense amplifiers SB1 to SBn in the region IV are connected to different activation lines SP1 and SP2, respectively. The activation line SP1 is connected to the power supply through PMOS transistors Q13 and Q14 connected in parallel. The activation line SP2 is connected to the power supply Vcc through PMOS transistors Q15 and Q16 connected in parallel. The gate of the transistor Q13 is connected to receive an output signal φd from the activation signal generating circuit 64 and the gate of the transistor Q15 is connected to receive an output signal φc. The gates of the transistors Q14 and Q16 are connected to receive a sense trigger signal $\overline{So}$.

The regions I and II have the same circuit structure as that of the regions III and IV as shown in FIG. 3B and are connected to receive output signals φb and φa from the circuit 64.

Figure 4:
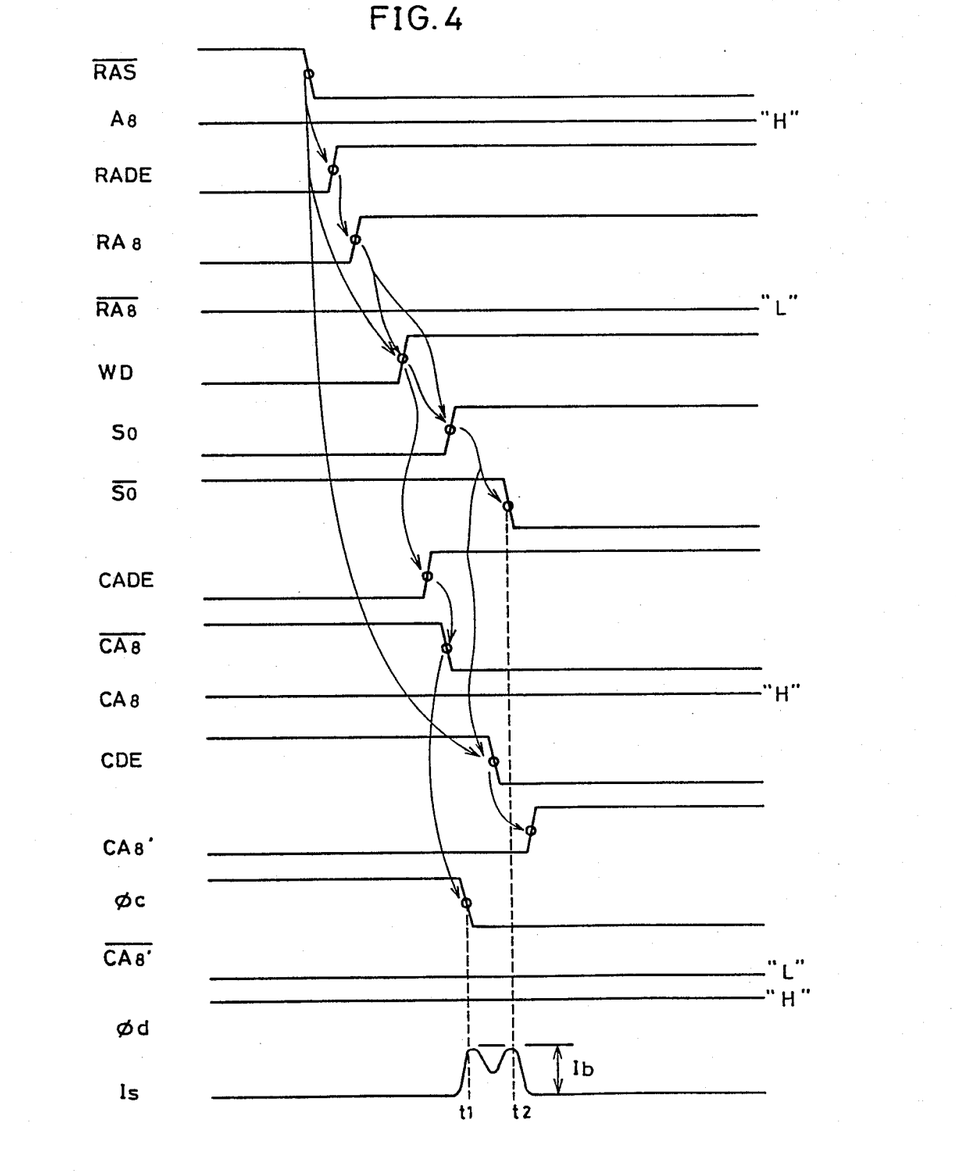
FIG. 4 is a timing chart for describing operation of the DRAM shown in FIG. 1.

FIG. 4 is a timing chart showing changes of control signals for operating the DRAM shown in FIG. 1. Referring to FIG. 4, as one example, a description is made of a case where the data signal stored in a memory cell MB1 in the region IV shown in FIG. 3B is read.

First, a signal RADE for taking in a row address signal $RA_8$ rises in response to the fall of a $\overline{RAS}$ signal. The row address signal $RA_8$ is taken in, in response to the signal RADE. A word line drive signal WD rises in response to the output of the signal $RA_8$. Sense trigger signals SO and $\overline{So}$ for activating the sense amplifier are outputted in response to the rise of the signal WD.

On the other hand, a signal CADE for taking in a column address signal $CA_8$ rises in response to the rise of the signal WD. A column address signal $\overline{CA_8}$ is taken in, in response to the signal CADE. A signal φc for activating the sense amplifier in the region IV falls in response to the input of the signal $\overline{CA_8}$. The signal CDE for starting operation of a column decoder falls in response to the fall of the $\overline{RAS}$ signal and the rise of the sense trigger signal So.

Looking at the changes of the signals for activating the sense amplifier from a viewpoint of a lapse of time, first the sense trigger signal So rises. Then the signal φc falls and the signal $\overline{So}$ falls. Referring to FIG. 3B, N channel sense amplifiers in the sense amplifiers SA1 to SAn and the SB1 to SBn in the regions III and IV are activated in response to the rise of the signal So. Almost at the same time, P channel sense amplifiers in the sense amplifies SB1 to SBn are activated in response to the fall of the signal φc. Therefore, at this time (time t1), a current Is consumed by the activation of the sense amplifiers shows a peak value Ib as shown in FIG. 4.

At a time t2, P channel sense amplifiers in the sense amplifiers SA1 to SAn in the region III are activated in response to the fall of the signal $\overline{So}$. Therefore, at this time (time t2), the current Is shows a peak value Ib. The peak value Ib of the current Is is naturally smaller than the peak value Ia of the current Is for activating the conventional sense amplifier shown in FIG. 9 because the sense amplifiers SB1 to SBn and SA1 to SAn in the regions IV and III are sequentially activated at different timings (the time t1 and t2).

The supply voltage can be prevented from lowering by reducing the peak value of the current for activating the sense amplifiers. In addition, the sensitivity of the sense amplifier can be prevented from deteriorating.

Although a description was made of the example of the DRAM, the present invention is also applicable to another semiconductor memory such as a static random access memory.

As described above, since the semiconductor memory device in accordance with the present invention comprises means for sequentially activating amplifying means in the region including a designated memory cell and the region not including the memory cell at different timings in response to the address signal, then it is possible to reduce a peak value of a current consumed by activation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory array (58) comprising a plurality of memory cells for storing a data signal;
   means (54) for receiving address signals to select a memory cell in said memory array (58),
   said memory array (58) comprising a first memory array region including a memory cell selected by said address signals and a second memory array region not including the selected memory cell;
   first amplifying means connected to said first memory array region of said memory array (58) for amplifying the data signal stored in the memory cell in said first memory array region;
   second amplifying means connected to said second memory array region of said memory array (58) for amplifying the data signal stored in a memory cell in said second memory array region; and
   sequentially activating means (64) connected to said first and second amplifying means for activating said first and second amplifying means in sequential order in response to the address signals, thereby sequentially amplifying data stored in memory cells in said first and second memory array regions whereby a peak value of current consumption is reduced.

2. A semiconductor memory device in accordance with claim 1, wherein said address signals comprise a row address signal and a column address signal and
   said first and second memory array regions are selected in response to the row address signal and the column address signal.

3. A semiconductor memory device comprising:
   a memory array (58) including a plurality of memory cells for storing a data signal;
   means (54) for receiving address signals to select a memory cell in said memory array (58),
   said memory array (58) comprising a first memory array region including a memory cell selected by said address signals and a second memory array region not including the selected memory cell;
   first amplifying means connected to said first memory array region of said memory array (58) for amplifying the data signal stored in the memory cell in said first memory array region;

second amplifying means connected to said second memory array region of said memory array (58) for amplifying the data signal stored in a memory cell in said second memory array region; and sequentially activating means (64) connected to said first and second amplifying means for activating said first and second amplifying means in sequential order in response to the address signals, wherein said first amplifying means comprises:

first sense amplifier means comprising field effect devices of one conductivity type; and second sense amplifier means comprising field effect devices of the other conductivity type, said first and second sense amplifier means constituting first complementary sense amplifier means, and said second amplifying means comprises:

third sense amplifier means comprising field effect devices on one conductivity type; and fourth sense amplifier means comprising field effect devices of the other conductivity type, said third and fourth sense amplifier means constituting second complementary sense amplifier means.

4. A semiconductor memory device in accordance with claim 3, wherein said sequentially activating means (64) activates said first and second complementary sense amplifier means in sequential order in response to an address signal.

5. A semiconductor memory device in accordance with claim 3, wherein said sequentially activating means (64) activates said first and third sense amplifier means in sequential order in response to an address signal.

6. A semiconductor memory device in accordance with claim 3, wherein said one conductivity type comprises a P type and said other conductivity type comprises an N type.

7. A semiconductor memory device comprising a dynamic random access memory, including:

a memory array (58) comprising a plurality of memory cells for storing a data signal;

means (54) for receiving address signals to select a memory cell in said memory array (58), said memory array (58) comprising a first memory array region including a memory cell selected by said address signals and a second memory array region not including the selected memory cell;

first amplifying means connected to said first memory array region of said memory array (58) for amplifying the data signal stored in the memory cell in said first memory array region;

second amplifying means connected to said second memory array region of said memory array (58) for amplifying the data signal stored in a memory cell in said second memory array region; and sequentially activating means (64) connected to said first and second amplifying means for activating said first and second amplifying means in sequential order in response to the address signals.

8. A method for operating a semiconductor memory device comprising a memory array (58) including a plurality of memory cells for storing a data signal, said method comprising the steps of:

receiving address signals for selecting a memory cell in said memory array (58), said memory array (58) being capable of being selectively divided into a first memory array region comprising the memory cell selected by said address signal and a second memory array region not including the selected memory cell;

amplifying the data signal stored in the memory cell in said first memory array region in response to the address signal; and amplifying the data signal stored in a memory cell in said second memory array region in response to the address signals, the data signal from a memory cell in said first memory array region being amplified before the data signal from a memory cell in said second memory array region is amplified whereby a peak value of current consumption is reduced by sequentially amplifying data stored in memory cells in said first and second memory array regions.

9. A method in accordance with claim 8, wherein said semiconductor memory device comprises a dynamic random access memory.

* * * * *